United States Patent
Josso et al.

(10) Patent No.: US 7,305,633 B2
(45) Date of Patent: Dec. 4, 2007

(54) DISTRIBUTED CONFIGURATION OF INTEGRATED CIRCUITS IN AN EMULATION SYSTEM

(75) Inventors: Frederic Josso, Chatillon (FR); Xavier Montagne, Houilles (FR); Frederic Reblewski, Paris (FR)

(73) Assignee: Mentor Graphics Corporation, Wilsonville, OR (US)

( * ) Notice: Subject to any disclaimer, the term of this patent is extended or adjusted under 35 U.S.C. 154(b) by 610 days.

(21) Appl. No.: 10/736,908

(22) Filed: Dec. 17, 2003

(65) Prior Publication Data

US 2004/0260530 A1    Dec. 23, 2004

Related U.S. Application Data

(63) Continuation-in-part of application No. 10/003,951, filed on Oct. 30, 2001, now Pat. No. 7,035,787.

(51) Int. Cl.
*G06F 17/50* (2006.01)
*G06F 9/455* (2006.01)

(52) U.S. Cl. ............................................ 716/4; 703/23

(58) Field of Classification Search .................... 716/1, 716/4; 703/23, 28, 20; 714/28, 775
See application file for complete search history.

(56) References Cited

U.S. PATENT DOCUMENTS

| | | | |
|---|---|---|---|
| 4,860,290 A | 8/1989 | Daniels et al. | |
| 5,036,473 A | 7/1991 | Butts et al. | |
| 5,109,353 A | 4/1992 | Sample et al. | |
| RE34,363 E | 8/1993 | Freeman | |
| 5,572,710 A | 11/1996 | Asano et al. | |
| 5,596,742 A | 1/1997 | Agarwal et al. | |
| 5,724,558 A * | 3/1998 | Svancarek et al. | ............ 703/21 |
| 5,777,489 A * | 7/1998 | Barbier et al. | ................. 326/40 |
| 5,802,348 A * | 9/1998 | Stewart et al. | ................. 703/25 |
| 5,821,773 A | 10/1998 | Norman et al. | |
| 5,870,586 A | 2/1999 | Baxter | |
| 5,943,490 A | 8/1999 | Sample | |

(Continued)

FOREIGN PATENT DOCUMENTS

EP    0651343 A1    5/1995

(Continued)

OTHER PUBLICATIONS

Erhard et al., W. First Steps Towards a Reconfigurable Asynchronous System, IEEE International Workshop on Rapid System Prototyping, 1999, pp. 28-31.
Kocan et al., F. Concurrent D-Algorithm on Reconfigurable Hardware, IEEE/ACM International Conference on Computer-Aided Design, 1999, Digest of Technical Papers, pp. 152-155.

(Continued)

*Primary Examiner*—Stacy Whitmore
(74) *Attorney, Agent, or Firm*—Jonathan T. Kaplan

(57) ABSTRACT

Data processing resources are distributively provided to an emulation system to locally and correspondingly configure emulation integrated circuits. In certain embodiments the data processing resources also perform emulation functions. In one embodiment, the distributed data processing resources are disposed on logic boards having emulation ICs that include the reconfigurable logic resources. In another embodiment, data processing resources receive commands transmitted from a workstation executing electronic design automation (EDA) software. In other embodiments, at least some of the distributed data processing resources are disposed on the emulation ICs. The board and IC disposed distributed data processing resources cooperatively perform the configuration and emulation functions as described.

29 Claims, 11 Drawing Sheets

U.S. PATENT DOCUMENTS

| | | | |
|---|---|---|---|
| 5,960,190 A * | 9/1999 | MacKenna | 703/28 |
| 5,963,735 A * | 10/1999 | Sample et al. | 703/24 |
| 6,002,861 A | 12/1999 | Butts et al. | |
| 6,184,707 B1 | 2/2001 | Norman et al. | |
| 6,265,894 B1 * | 7/2001 | Reblewski et al. | 326/39 |
| 6,282,503 B1 | 8/2001 | Okazaki et al. | |
| 6,377,912 B1 | 4/2002 | Sample et al. | |
| 6,388,465 B1 | 5/2002 | Barbier et al. | |
| 6,473,726 B1 * | 10/2002 | Reblewski | 703/26 |
| 6,625,793 B2 | 9/2003 | Sample et al. | |
| 6,694,464 B1 | 2/2004 | Quayle | |
| 6,832,185 B1 * | 12/2004 | Musselman et al. | 703/23 |
| 6,961,691 B1 * | 11/2005 | Selvidge et al. | 703/28 |
| 2002/0049578 A1 * | 4/2002 | Ohkami | 703/15 |

FOREIGN PATENT DOCUMENTS

| | | |
|---|---|---|
| WO | WO 94/06210 | 3/1994 |

OTHER PUBLICATIONS

Clos, Charles, "A Study of Non-Blocking Switching Networks," The Bell System Technical Journal, Mar. 1953, pp. 406-424.

Bosi et al., B. Reconfigurable Pipelined 2-D Convolvers for Fast Digital Signal Processing, IEEE Transactions on Very Large Scale Integration (VLSI) Systems, vol. 7, Issue 3, Sep. 1999, pp. 299-308.

Ejnioui et al., A. Design Partitioning on Single-Chip Emulation Systems, 13th International Conference on VLSI Design, 2000, pp. 234-239.

Jean, J.S.N., et al., "Dynamic Reconfiguration to Support Concurrent Applications," IEEE Transactions on Computers, Jun. 1999, IEEE, USA, vol. 48, No. 6, pp. 591-602.

Snider, G., "The Teramac Compiler," Nov. 29, 1993, pp. 1-51.

Xilinx, "The Programmable Gate Array Design Handbook", First Edition, 1986, pp. i-A10.

Babb, J, et al., "Logic Emulation with Virtual Wires," IEEE Transactions on Computer-Aided Design of Integrated Circuits and Systems, Jun. 1997, pp. 1-20.

* cited by examiner

RLR = Reconfigurable Logic Resources
RIN = Reconfigurable Interconnect Network
MEM = Memory
DBR = Debugging Resources
CTX = Context (State) Elements
CR = Configuration Registers.

500

502 504 506 508

RLR = Reconfigurable Logic Resources
RIN = Reconfigurable Interconnect Network
MEM = Memory
DBR = Debugging Resources
CTX = Context (State) Elements
Config = Configuration registers.

DISTRIBUTED CONFIGURATION OF INTEGRATED CIRCUITS IN AN EMULATION SYSTEM

This application is a continuation-in-part of U.S. patent application Ser. No. 10/003,951, entitled "EMULATION COMPONENTS AND SYSTEM INCLUDING DISTRIBUTED ROUTING AND CONFIGURATION OF EMULATION," filed on Oct. 30, 2001 now U.S. Pat. No. 7,035,787.

FIELD OF THE INVENTION

The present invention relates to the field of emulation. More specifically, the present invention relates to distributively configuring emulation components using local data processing resources.

BACKGROUND OF THE INVENTION

First generation emulation systems were typically formed using general purpose field programmable gate arrays (FPGAs) without integrated debugging facilities. To emulate a circuit design on one of such emulation systems, the circuit design would be "realized" by compiling a formal description of the circuit design, partitioning the circuit design into subsets, mapping the various subsets to the logic elements (LEs) of the FPGAs of various logic boards of the emulation system, and then configuring and interconnecting the LEs. The partitioning and mapping operations would be typically performed on workstations that were part of or complementary to the emulation systems, while the configuration information would be correspondingly downloaded onto the logic boards hosting the FPGAs, and then onto the FPGAs themselves.

With advances in integrated circuit and emulation technology, later emulation systems employed special custom-designed FPGAs specifically for emulation purposes. These special FPGAs typically would include a substantial number of resources such as on-chip reconfigurable logic elements, interconnects, memory, and debugging resources. As the advances continued, more of these resources were packed into each FPGA. As a result, more control signals had to be transferred onto each logic board (for transfer into the FPGAs) to configure the FPGAs. Thus, the amount of configuration data that needed to be transferred from the compile workstation to configure the emulation resources has continued to increase. Likewise, more information about the states of the logic elements needed to be transferred out of the FPGAs and logic boards to facilitate analysis, leading to bottlenecks, in particular at the logic boards, preventing efficient operation of the emulation systems.

For at least these reasons, an improved configuration technique and approach to forming and operating emulation systems is desired.

SUMMARY

According to at least one aspect of the present invention, data processing resources may be distributed in an emulation system so as to locally and correspondingly generate configuration signals, responsive to configuration commands received by the data processing resources, to configure selected ones of reconfigurable logic resources of corresponding collections of reconfigurable logic resources. In one embodiment, distributed data processing resources receive configuration commands transmitted from a workstation executing electronic design automation (EDA) software.

In accordance with a first aspect, an emulation logic board features at least one emulation integrated circuit (IC) having reconfigurable logic resources and on-board processing resources, in communication with the at least one emulation IC, operable to configure the emulation IC.

In accordance with a second aspect, in an emulation logic board featuring at least one emulation integrated circuit (IC) and on-board processing resources, a method of configuring the emulation logic board features the steps of receiving, by the on-board processing resources, a command for configuring the logic board, and configuring the emulation IC in accordance with the command received by the on-board processing resources.

In accordance with another aspect, an emulation system features a workstation having electronic design automation (EDA) software to partition an integrated circuit (IC) design into a plurality of partitions, and at least one emulation logic board, in communication with the workstation, featuring at least one emulation IC, and on-board processing resources, in communication with the emulation IC and operable to configure the emulation IC in response to commands from the EDA software of the workstation.

In accordance with another aspect, an emulation apparatus features a plurality of collections of reconfigurable logic resources, a plurality of collections of reconfigurable I/O resources, and a plurality of groups of data processing resources correspondingly coupled to the collections of reconfigurable logic and I/O resources to correspondingly and distributively generate configuration signals to configure selected ones of reconfigurable logic and I/O resources.

In accordance with another aspect, an emulation integrated circuit (IC) features a plurality of reconfigurable logic resources, a plurality of reconfigurable I/O resources, and on-chip data processing resources, coupled to the reconfigurable logic and I/O resources, operative to configure the reconfigurable logic and I/O resources.

In accordance with another aspect, in an emulation integrated circuit (IC) having a plurality of reconfigurable logic resources, a plurality of reconfigurable I/O resources, and on-chip data processing resources, coupled to the reconfigurable logic and I/O resources, operative to configure the reconfigurable logic and I/O resources; a method of operation comprises receiving, by the on-chip processing resources, an external command for configuring the emulation IC, and configuring the reconfigurable logic and I/O resources in accordance with the external command received by the on-chip processing resources.

In accordance with another aspect, an emulation logic board comprises at least one integrated circuit having reconfigurable logic resources, and on board processing resources, in communication with the at least one integrated circuit, operable to receive a configuration command and generate a configuration signal, in response to the configuration command, to configure the integrated circuit.

In accordance with another aspect, an emulation logic board comprises at least one integrated circuit having reconfigurable logic resources, and on board processing resources, in communication with the at least one integrated circuit, operable to receive a first set of configuration commands and translate the first set of commands into a second set of configuration commands different from the first set. The second set of configuration commands may be longer than the first set. In other words, the second set may require more bits than the first set.

In accordance with another aspect, a method comprises receiving at an emulation logic board a first set of configuration commands associated with a design, generating locally at the emulation logic board a second set of configuration commands based on the first set of configuration commands; and configuring an emulation integrated circuit to map at least the portion of the design in accordance with the second set of configuration commands.

These and additional features and advantages disclosed here will be further understood from the following detailed description of illustrative embodiments.

BRIEF DESCRIPTION OF THE DRAWINGS

The present invention will be described by way of illustrative embodiments, shown in the accompanying drawings in which like references denote similar elements, and in which.

DETAILED DESCRIPTION OF ILLUSTRATIVE EMBODIMENTS

Figure 1:
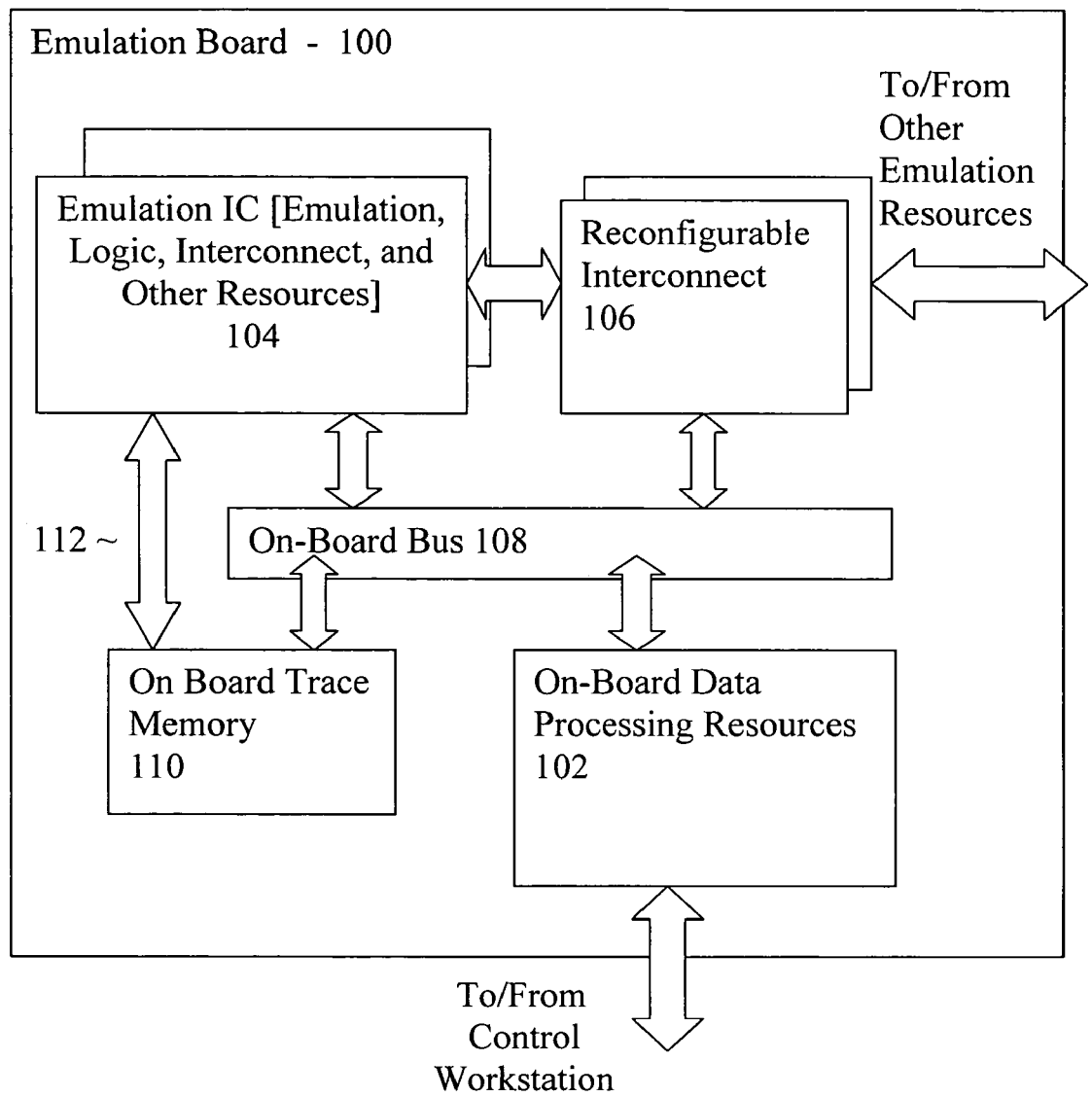
FIG. 1 is a functional block diagram of an illustrative logic board in accordance with at least one aspect of the present invention.

Referring to the illustrative embodiment of FIG. 1, a logic board 100 may include on-board data processing resources 102, one or more on-board emulation ICs 104, on-board reconfigurable interconnects 106, on-board bus 108, and/or on-board trace memory 110 coupled to each other as shown (e.g., through on-board bus 108). Additionally, on-board emulation ICs 104 may be directly coupled to on-board trace memory 110. As used here, the term on-board means being physically present on the logic board. Logic board 100 may further include a number of input/output (I/O) pins (not explicitly illustrated). A first subset of I/O pins may be employed to couple selected ones of the outputs of reconfigurable interconnects 106 to reconfigurable interconnects of other logic boards (thereby coupling the emulation resources of the logic boards). A second subset of I/O pins may be employed to couple data processing resources 102 to certain control resources, such as a control workstation. Accordingly, an emulation system may be formed using one or more logic boards 100 and control resources, wherein each logic board 100 may have its own data processing resources 102. The data processing resources 102 of the various logic boards 100 may each be employed to locally configure some or all of the emulation ICs 104 and/or reconfigurable interconnects 106 of the corresponding logic board 100. As a result, the efficiency of the emulation system may be improved.

Reconfigurable interconnects 106 facilitate coupling of the emulation resources of the various emulation ICs 104 on the same logic board 100 and/or among different logic boards 100. On-board bus 108 and trace memory 110 facilitate, respectively, on-board communication/data transfers and collection of emulated design states and signals.

The on-board data processing resources 102 of each logic board 100 may perform configuration functions that may include local generation of configuration signals to configure the emulation resources of the on-board emulation ICs 104 and/or other on-board emulation resources, such as reconfigurable interconnects 106. Thus, the on-board data processing resources 102 may together distributively configure the emulation and/or interconnect resources of the various logic boards 100. The data processing resources 102 may perform such configuration responsive to commands generated by one or more sources external to the logic boards 100. For example, such commands may include configuration requests from the control resources of the emulation system.

The on-board data processing resources 102 may further locally generate (at the board level) testing stimuli and/or apply the generated testing stimuli to the appropriate nodes of the design being emulated. The on-board data processing resources 102 of each logic board 100 may further locally determine (at the board level) the states of the various nodes and/or storage elements of the design, and/or perform triggering functions.

The on-board data processing resources 102 may also locally perform a confirmation of a configuration wherein a performed configuration is compared against received configuration commands. The results of the confirmation can then be provided to external entities outside the logic board 100.

The novel manners in which these configuration functions are performed may provide at least the advantage of reducing the amount of control signals and data needed to be transferred in and out of emulation logic board 100 to configure emulation resources of emulation ICs 104 to emulate and/or debug a design. This is because a first set of configuration commands may be provided by a workstation to emulation logic board 100, and in response to the first set of commands a second set of configuration commands may be locally generated by on-board resources at emulation logic board 100, wherein the first set of configuration commands and data uses less bits than the second locally-generated set.

Figure 2A:
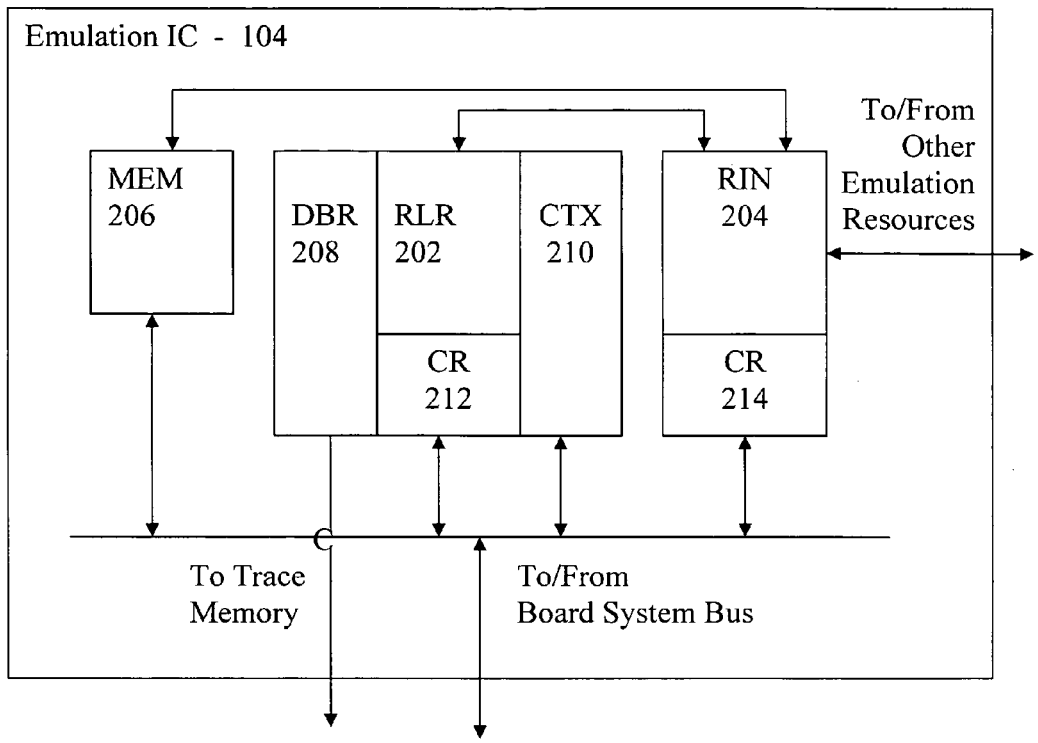
FIGS. 2a and 2b are functional block diagrams of the hosted emulation IC of FIG. 1 shown in further detail, including illustrative on-chip debugging resources shown in further detail, in accordance with at least one aspect of the present invention.
Figure 2B:
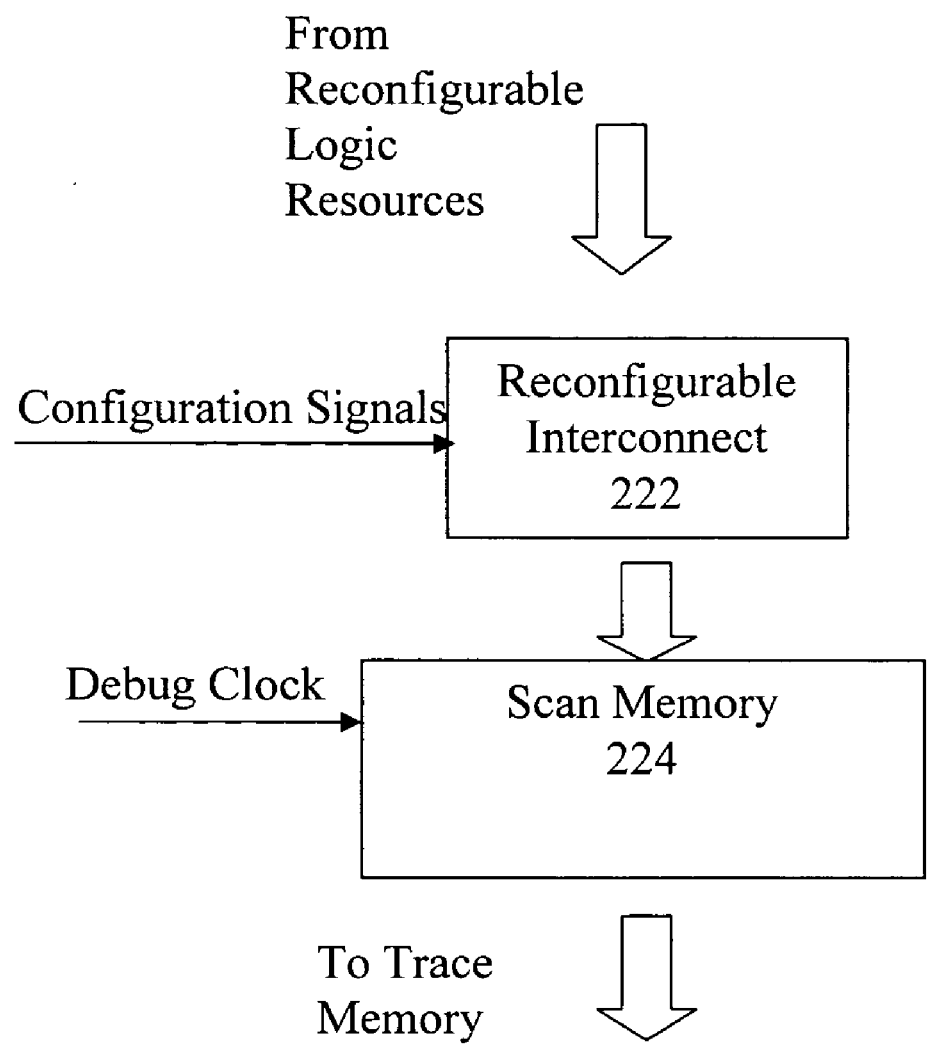

Referring to FIGS. 2a-2b, emulation IC 104 may include reconfigurable logic resources (RLRs) 202 such as reconfigurable logic elements, reconfigurable interconnects (RIN) 204, emulation memory (MEM) 206, debugging resources (DBR) 208, context or state elements (CTX) 210, and/or configuration registers (CR) 212 and 214 coupled to each other as shown. Emulation IC 104 may further include a number of uni-directional and/or bi-directional reconfigurable 110 resources (not shown) that may be configurable as either input or output resources coupled to one or more of the above-mentioned elements. Examples of such I/O resources are configurable I/O pins. RLRs 202, emulation memory 206 and/or context/state elements 210 may be used to "realize" circuit elements of the netlists of an assigned partition of a design. In particular, RLRs 202 are used to "realize" the combinatorial or sequential logic of the netlists of the design, context/state elements 210 are used to "realize" state elements of the design, such as flip-flops and so forth, and emulation memory 206 is used to "realize" storage elements of the design. Reconfigurable interconnects 204 are used to reconfigurably couple RLRs 202, context/state elements 210, and/or emulation memory 206 with each other.

Referring to FIG. 2b, debugging resources 208 of emulation IC 104 may include scan memory 224 and/or reconfigurable interconnect 222 reconfigurably coupling scan memory 224 to RLRs 202. On-board trace memory 110 may receive output from the scan memory 224.

Scan memory 224 may be designed to operate responsive to a debug clock that may be faster than the emulation clock. Accordingly, during one emulation clock cycle, scan memory 224 may enable signal states of different signals of the design to be captured.

Figure 3:
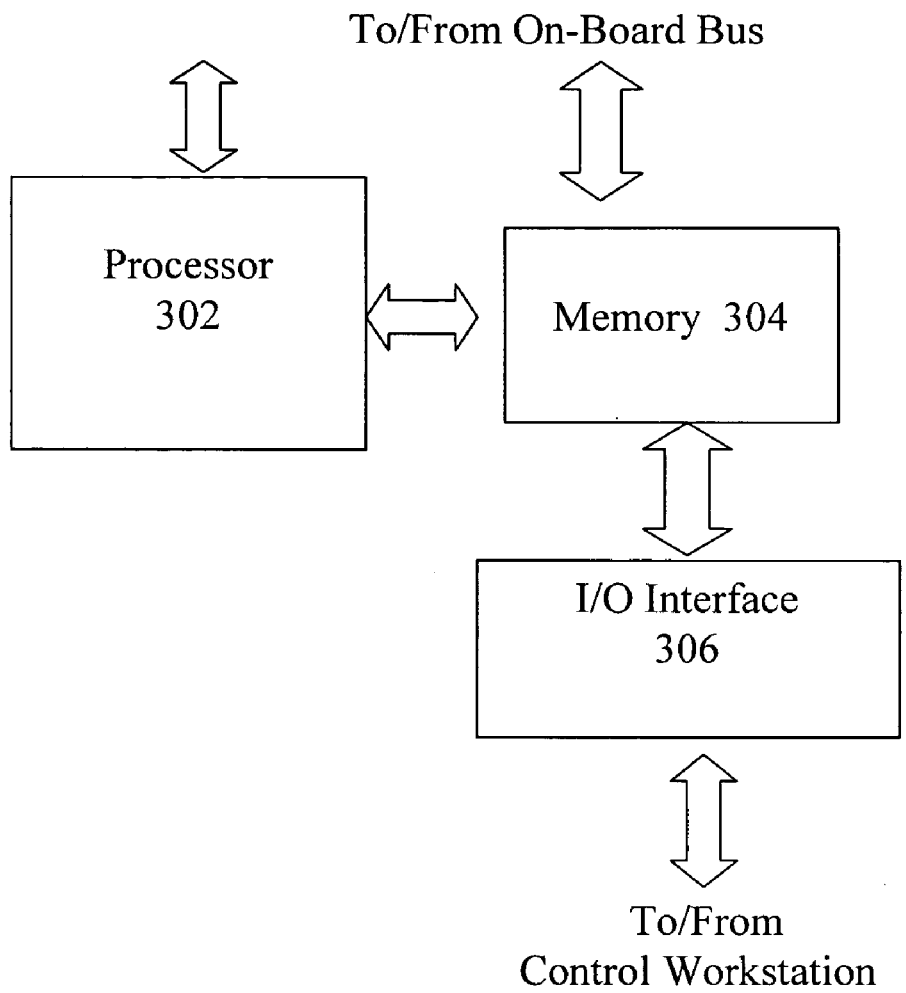
FIG. 3 is a functional block diagram of the on-board data processing resources of FIG. 1 shown in further detail, in accordance with at least one aspect of the present invention.

Referring to FIG. 3, data processing resources 102 may include a processor 302, a memory 304 (e.g., a dynamic random access memory), and/or an I/O interface 306, coupled to each other as shown. Processor 302, memory 304 and/or I/O interface 306 may further be coupled to logic board bus 108.

Memory 304 may be used to store a working copy of software and/or data used for performing routing determination, configuration signal generation, triggering, test stimuli generation, and/or pre-processing of captured signal states. The software and data may be downloaded to memory 304 during initialization. The download may be staged, wherein software associated with interconnect routing determination and configuration signal generation may be downloaded first and software associated with distributed debugging and testing operations may be downloaded later. Logic board 100 may be provided with non-volatile storage such that a "permanent" copy of a subset or all of the requisite software may be stored. Processor 302 may be used to execute the software and effectuate performance of the aforementioned functions, whereas I/O interface 306 may couple processor 302 with other entities external to logic board 100.

Figure 4:
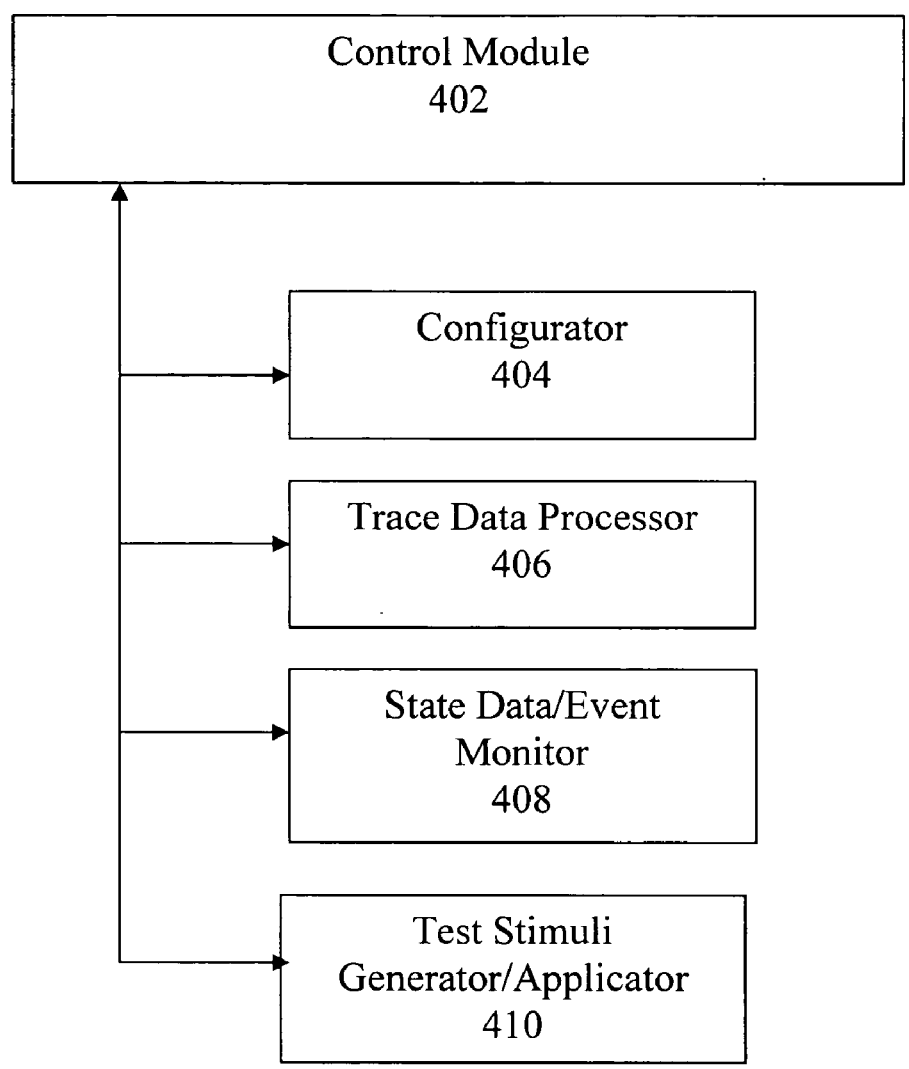
FIG. 4 is a functional block diagram of illustrative software modules provided to the data processing resources of FIG. 3, in accordance with at least one aspect of the present invention.

FIG. 4 illustrates an overview of the software modules that may be provided to on-board data processing resources 102. Software 400 may include control module 402, and functional modules, which may include configurator 404, trace data processor 406, state data/event detector 408, and/or test stimuli generator 410.

Software control module 402 may be configured to facilitate the overall operation of the delivery of desired functions, including communication with external entities outside the logic board 100 and invocation of appropriate ones of the functional modules 404, 406, 408, 410. In one embodiment, control module 402 communicates with the external entities on a request and response transaction basis, via communication packets. That is, the assigned netlists, the configuration, signal state, state data of state elements, and/or testing requests may be made, acknowledged and responded to using transaction messages sent and received in a series of communication packets. Other communication techniques may further be used.

In one embodiment, control module 402 communicates with the external entities using the above-indicated packet communication paradigm in accordance with a command protocol, whereby control module 402 in conjunction with one or more of the aforementioned functional modules (e.g., configurator 404) receives one or more packets including a command or series of commands (e.g., configuration commands). That is, control module 402 may receive configuration commands in lieu of configuration information for the assigned reconfigurable resources of the assigned netlists, thereby reducing the amount of data received from external entities outside logic board 100.

Thus, processor 302 can use the software 400 stored in memory 304 to translate a first set of commands received in as communication packet by the processing resources 102 into a second set of commands, such as those typically used to configure the resources of the logic board 100 to map at least a portion of a design.

Figure 5:
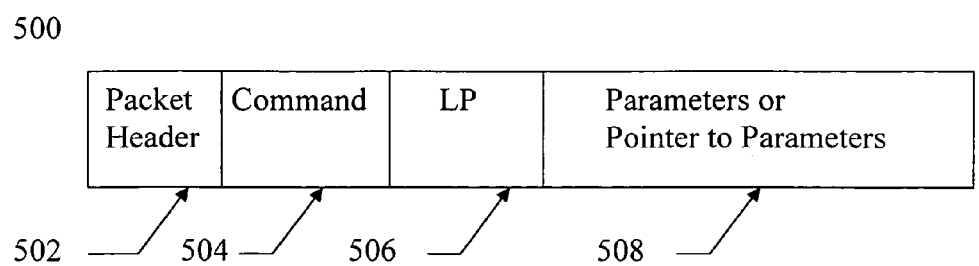
FIG. 5 show an illustrative data packet that may be used to communicate with the data processing resources of FIG. 1, in accordance with at least one aspect of the present invention.

As shown in FIG. 5, an illustrative communication packet 500 includes packet header 502, command field 504, length of packet field 506, and zero or more parameters (or pointers to the parameters) 508 associated with the specified commands. Packet header 502 facilitates provision of various communication related control information. Command 504 facilitates communication between processor 302 and the external entities on the tasks to be performed, and their results. Length of packet can be indicated by two ways. It can depend on the command or be the first parameter inside the packet. Parameters or pointers 508 augment the commands or return of results, where appropriate.

In one embodiment, command 504 comprises a configuration command that, by itself or together with associated parameters or pointers 508 within communication packet 500, is received by embedded processor 302 in conjunction with the other functional blocks comprising on-board data processing resources 102 (e.g., memory 304 and I/O interface 306). The processor 302 may generate corresponding configuration signals to configure selected ones of reconfigurable logic resources 202 and/or reconfigurable interconnect network 204 associated with emulation IC 104. Thus, communication packet 500, as illustrated in FIG. 5, may provide on-board (embedded) processor 302 configuration commands in lieu of the detailed configuration signals associated with configuring the assigned netlists, or at least some portion of the assigned netlists, thereby reducing the amount of data received from external entities outside a logic board 100.

Figure 6A:
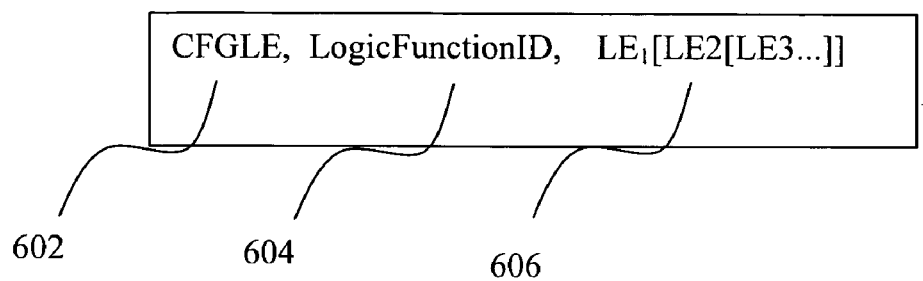
FIGS. 6a-6c and 7a show illustrative configuration commands in accordance with at least one aspect of the present invention.

Referring to FIG. 6a, consider an emulation IC 104 comprising five hundred twelve (512) reconfigurable LEs (included in RLR 202), each reconfigurable LE represented functionally as a four-input, single-output look up table (LUT), and a requirement, for instance, for one-half of the 512 reconfigurable LEs to be configured to emulate various AND, NAND, OR, and NOR gates of a combinatory circuit design. FIG. 6a illustrates an illustrative configuration command 602 ("CFGLE") with associated parameters 604 and 606 for configuring these LEs as desired via simple, configuration bit saving commands. Parameters 606 specify which reconfigurable LEs are to be configured to emulate the logic circuit element of the type specified by LogicFunctionID 604. For instance, LogicFunctionID 604 might be "OR," indicating that the reconfigurable LEs specified are to be configured as logical OR gates. Alternatively, LogicFunctionID 604 might be "AND," indicating that the reconfigurable LEs 202 specified are to be configured as logical AND gates. The particular syntax for parameter 606 is implementation specific. The parameter 606 "$LE_1[LE_2[LE_3 \ldots ]]$", for example, may indicate either a single reconfigurable LE ("$LE_1$"), or a list of reconfigurable LEs (e.g., "$LE_1, LE_2, LE_5, LE_{35}, \ldots$"), or even a range of reconfigurable LEs (e.g., "$LE_1$-$LE_{50}$") to be configured to emulate the logic circuit element of type LogicFunctionID 604.

Figure 6B:
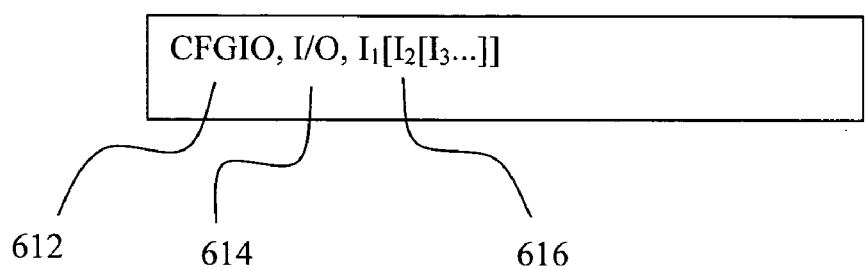

For the above example, a number of distinct configuration commands, e.g., one each for each type of configuration ("CFGLE, OR, $LE_7, LE_{20}, LE1_{27} \ldots$"), may be provided to on-board data processing resources 102 using communication packets 500, resulting in local and corresponding generation or translation by on-board data processing resources 102 of the appropriate 16 configuration bits (or configuration signal) for the corresponding 256 reconfigurable LEs 202. In each case, the on-board data processing resources 102 may determine the appropriate sixteen bit (for example) configuration patterns to configure each of the applicable reconfigurable LEs and then apply the configuration signals to configure each of the applicable reconfigurable LEs. Thus, for this example, the amount of data received from external entities outside logic board 100 is reduced by at least the difference between the combined lengths of communication packets 500 comprising the configuration commands and (addr+16)×256 configuration bits (where "addr" stands for the number of bits required to designate a LE of an emulation IC). Referring now to FIG. 6b, an example is illustrated of a configuration command 612 "CFGIO" designed to configure I/O resources associated with an emulation IC 104 to perform as either "input" resources or "output" resources, depending upon parameter 614 specifying "I" for input or "O" for "Output", and parameter 616 specifying which of the I/O pins of the emulation IC 104 are to be so configured. Similar to the notation used in FIG. 6a, the notation shown for parameter 616 "$I_1[I_2[ \ldots ]]$", in one example, indicates a single I/O pin (e.g., "$I_1$"), a list of I/O pins (e.g., "$I_1, I_2, I_5, \ldots$"), or even a range of I/O pins (e.g., "$I_1$-$I_5$") to be configured as "input" or "output" pins according to parameter 614.

Figure 6C:
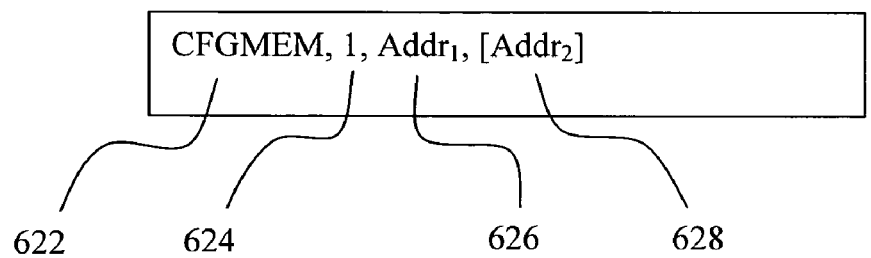

Next, as illustrated in FIG. 6c, is an example of a configuration command 622 "CFGMEM" designed to initialize memory resources 206 associated with emulation IC 104. Parameter 824, in one embodiment, designates the binary value ("1" or "0") that is to be placed in a particular memory location, a number of discontiguous memory locations or a range of contiguous memory locations. Parameter 626 and/or parameter 628 specify the memory locations to be initialized. Parameter 626, if specified alone, denotes a single memory location, and if specified in conjunction with parameter 628 designates the first memory location for initialization. Parameter 628 designates the last memory address in the range of "$Addr_1$" 626 to "$Addr_2$" 628 to be initialized. If, for example, parameter 628 is omitted, the command may be interpreted as having initialization begins at parameter 626 "$Addr_1$" and continues through successive memory locations until all remaining locations of the memory resource have been initialized. Thus, for such an embodiment, if the configuration command "CFGMEM, 1, 1", is specified without parameter 628 "$Addr_2$", data processing resources 102 initializes all memory address locations to the binary value "1". Therefore, a 16K memory resource 206, for instance, can be initialized using one configuration command, the on-board data processing resources 102 thereafter locally and distributively sending the 16K initialization bits to memory resource 206, thereby reducing the amount of data received from external entities outside a logic board 100.

Figure 7A:
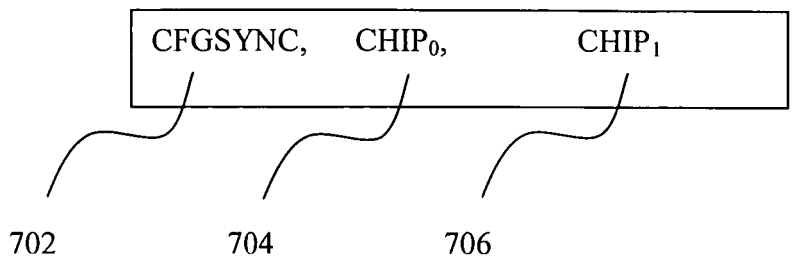

FIG. 7a illustrates a more complex example of a configuration command 702 "CFGSYNC" designed for specifying the desired synchronization of two verification (emulation) ICs 104. As shown in FIG. 7a, parameter 704 "$CHIP_0$" and parameter 706 "$CHIP_1$" specify the two emulation ICs 104 to be synchronized. Upon receiving configuration command 702 and parameters 704 and 706 via communication packet 500, on-board data processing resources 102 locally and distributively implement the enumerated illustrative steps shown in FIG. 7b. Each of the enumerated example steps shown in FIG. 7b involves one or more interactions between on-board data processing resources 102 and emulation ICs 104.

Figure 7B:
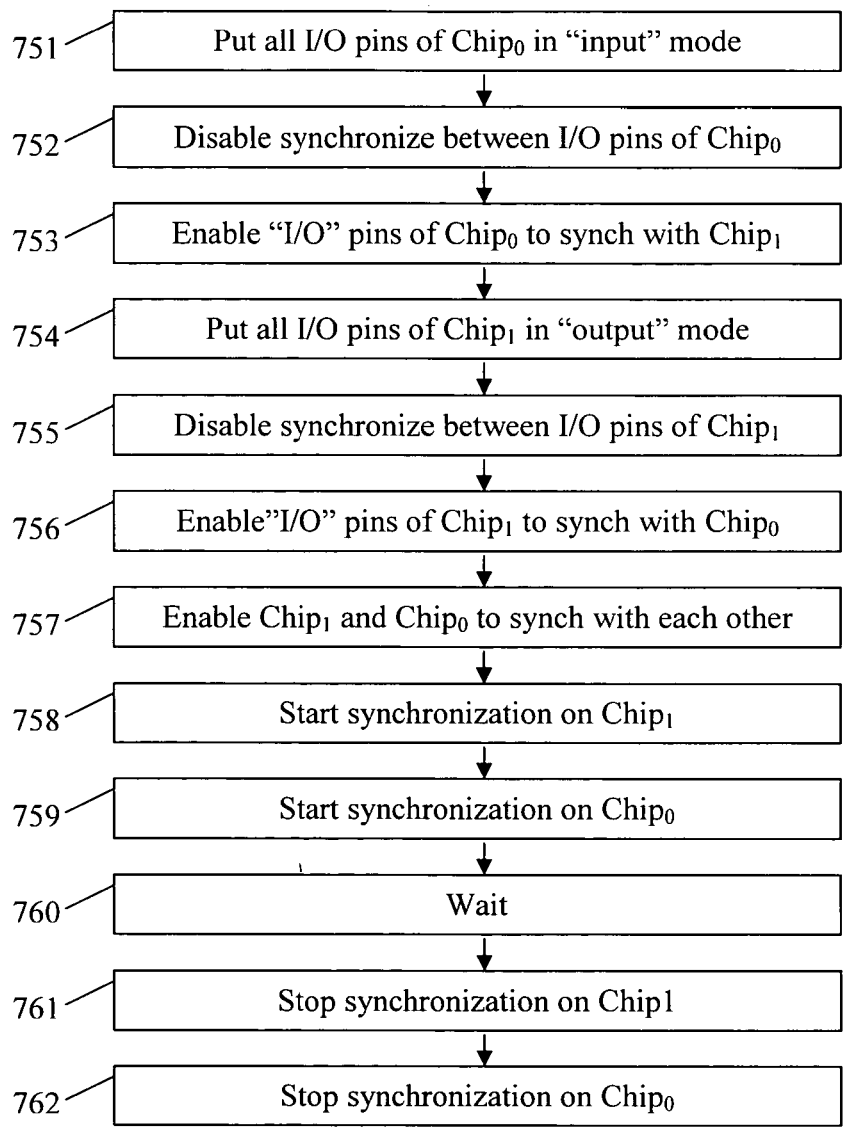
FIG. 7b is a flowchart showing illustrative steps that may be performed by data processing resources in response to the configuration commands shown in FIG. 7a, in accordance with at least one aspect of the present invention.

As shown in FIG. 7b, step 751 involves configuring the I/O pins associated with emulation IC 104 "$CHIP_0$" to perform as "input" pins. That is, in step 751, the bi-directional I/O pins associated with emulation IC 104 "$CHIP_0$" are configured as input pins. Next, in step 752, synchronization between the I/O pins associated with emulation IC 104 "$CHIP_0$" is disabled, and, in step 753, "$CHIP_0$" is enabled for synchronization with "$CHIP_1$". Steps 754-756 for "$CHIP_1$" mirror steps 751-753 for "$CHIP_0$". That is, the I/O pins associated with "$CHIP_1$" are configured as output pins in step 754, and synchronization between the I/O pins associated with "$CHIP_1$" is disabled. Next, in step 756, the I/O pins of "$CHIP_1$" are configured to be synchronized to I/O pins of "$CHIP_0$".

Next, the synchronization is enabled and started (steps 758 and 759), and, after a time period (step 760), synchronization is stopped for each emulation IC 104 ("$CHIP_0$" and "$CHIP_1$") (steps 761 and 762).

Thus, a configuration command 702 as shown in FIG. 7a, sent via communication packet 500, may be provided to on-board (embedded) processor 302 in lieu of the detailed configuration signals associated with each of the implementation steps shown in FIG. 7b, thereby reducing the amount of data received from external entities outside a logic board 100.

As those skilled in the art would appreciate, the syntaxes employed in the above examples are merely illustrative in purpose. In alternate embodiments, other syntaxes may be employed instead. Further, additional configuration bit saving commands may be devised. Of course, the present invention may also be practiced without some of the above-described configuration bit saving commands.

Referring back to FIG. 4, configurator 404 has logic to locally, correspondingly, and distributively generate the configuration bits necessary to configure the reconfigurable logic and interconnect resources of emulation ICs 104, and the applicable interconnect resources of the logic board. Such configuration may be in accordance with the reconfigurable logic resources and board level interconnect (centrally determined) and the reconfigurable interconnect within the emulation ICs 104 (locally determined), and responsive to configuration requests. Similarly, except that generation of the configuration bits is locally performed on the "assigned" logic board, the tasks of generating configuration bits in accordance with a resource allocation are otherwise substantially the same as the tasks that are centrally and conventionally performed on a control workstation.

Trace data processor 406 has logic to locally pre-process the captured signal states of the emulation signals to determine one or more signal states of one or more signals of interest of the netlists of the assigned partition of the IC design being emulated, responsive to trace data requests. Again, except for the fact that the captured signal states of the emulation signals are pre-processed locally, reconfiguration of debugging resources and processing of capture signal states may be otherwise substantially the same as the tasks that are conventionally performed on a control workstation.

State data/event monitor 408 has logic to monitor emulation state elements to detect one or more events. State data/event monitor 408 is further equipped to report the occurrences of the events upon detecting their occurrences. Test vector generator/applicator 410 has logic to locally, correspondingly, and distributively generate and apply testing stimuli to the netlists of the design. Test vector generator/applicator 410 is intended to represent a broad range of testing software known in the art. Similarly, except for the fact that retrieval of state data, event detection, generation and application of test stimuli are locally performed, each of these operations may be substantially the same as the operations conventionally performed at the control workstation.

Figure 8:
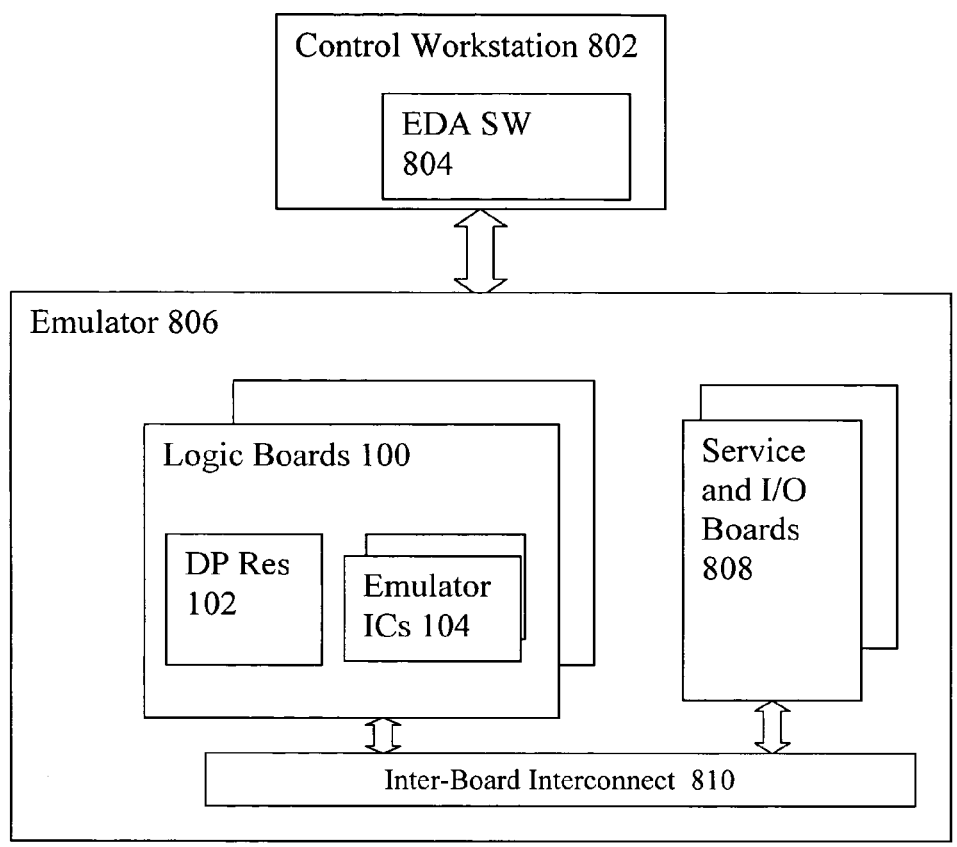
FIG. 8 is a functional block diagram of an illustrative emulation system in accordance with at least one aspect of the present invention.

Referring now to FIG. 8, illustrative emulation system 800 includes control workstation 802 and emulator 806. Control workstation 802 has electronic design automation (EDA) software 804. Emulator 806 includes one or more logic boards 100, each having at least one emulation IC 104 and on-board data processing resources 102 disposed thereon as described earlier. In addition to logic boards 100, emulator 806 also includes service and I/O boards 808. Boards 100 and 808 are interconnected by inter-board interconnects 810. In one embodiment, various boards 100 and 808 are packaged together to form a crate, and the crates are interconnected together via inter-board interconnect 810. The precise numbers of emulation ICs 104 disposed on each board, as well as the precise manner in which the various boards are packaged into crates may vary depending on the embodiment.

EDA software 804 may be used to determine the distribution of emulation logic board level routing and configuration of the emulation resources and the logic boards themselves. EDA software 804 is intended to represent a broad range of the software typically supplied with an emulation system, including in particular software for partitioning the netlists of a design at the system level, and software for debugging and testing a design such as model simulators.

Figure 9:
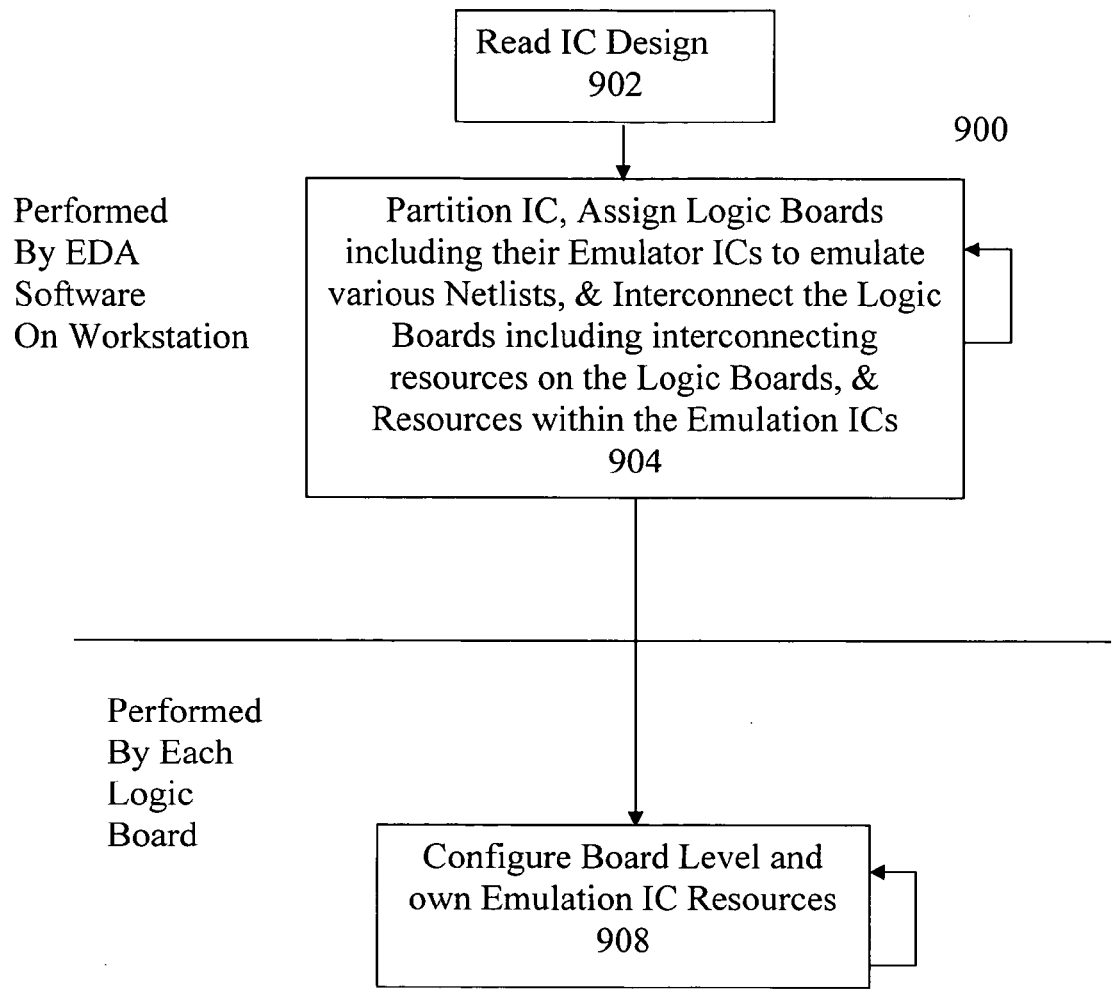
FIG. 9 is a flow chart showing an illustrative method for distributively configuring reconfigurable resources of an emulation system, in accordance with at least one aspect of the present invention.

Referring now to FIG. 9, in an emulation system such as shown in FIG. 8, a method of configuring an Emulation IC starts with the EDA software 804 on workstation 802 reading a design to be emulated, 902. EDA software 804 first partitions the netlists of the design into partitions to be emulated by one or more emulation ICs 104 of one or more logic boards 100, assigning the netlists of the various partitions to the one or more logic boards 100, 904. The EDA software 804 may also determine routing between multiple logic boards 100, between emulation ICs 104 on logic boards 100, and between emulation resources within each emulation IC 104 to interconnect the allocated emulation resources of the assigned emulation ICs 104 of the logic boards, 904. Further, EDA software 804 provides the various logic boards 100 with the relevant assignment and routing information, 904, as well as requests the configuration bits for configuring the various reconfigurable logic and interconnect resources to be generated locally by the corresponding logic boards 100. In one embodiment, the configuration bits for configuring the various reconfigurable logic and interconnect resources are to be generated locally by on-board data processing resources 102 associated with the corresponding logic boards 100, responsive to configuration commands from EDA software 804. In some embodiments, the provision and request operations are iteratively re-performed as necessary.

Upon receipt of the provided assignment and routing information, and the configuration requests and commands, the configuration software, executed by data processing resources 102 of the one or more logic boards 100, locally and correspondingly generate the appropriate configuration bits to configure the allocated emulation resources of the hosted emulation ICs 104, and the on-board resources of logic boards 100 according to the centrally determined partition and board level routing, and locally determined within emulation IC routing, 908. In some embodiments, the provision and request operations are iteratively re-performed as necessary. As a result, the amount of signals having to be transferred to the various emulation logic boards 100 to configure the emulation resources of their hosted emulation ICs 104 to realize an IC design is advantageously reduced.

In some embodiments, a "write and check" function may be implemented wherein the configuration of resources is compared to the configuration commands received. The results of this "check" can then be transferred back to the workstation 900. Performing this functionality locally on the one or more logic boards 100 allows it to be performed on multiple boards at the same time.

Figure 10:
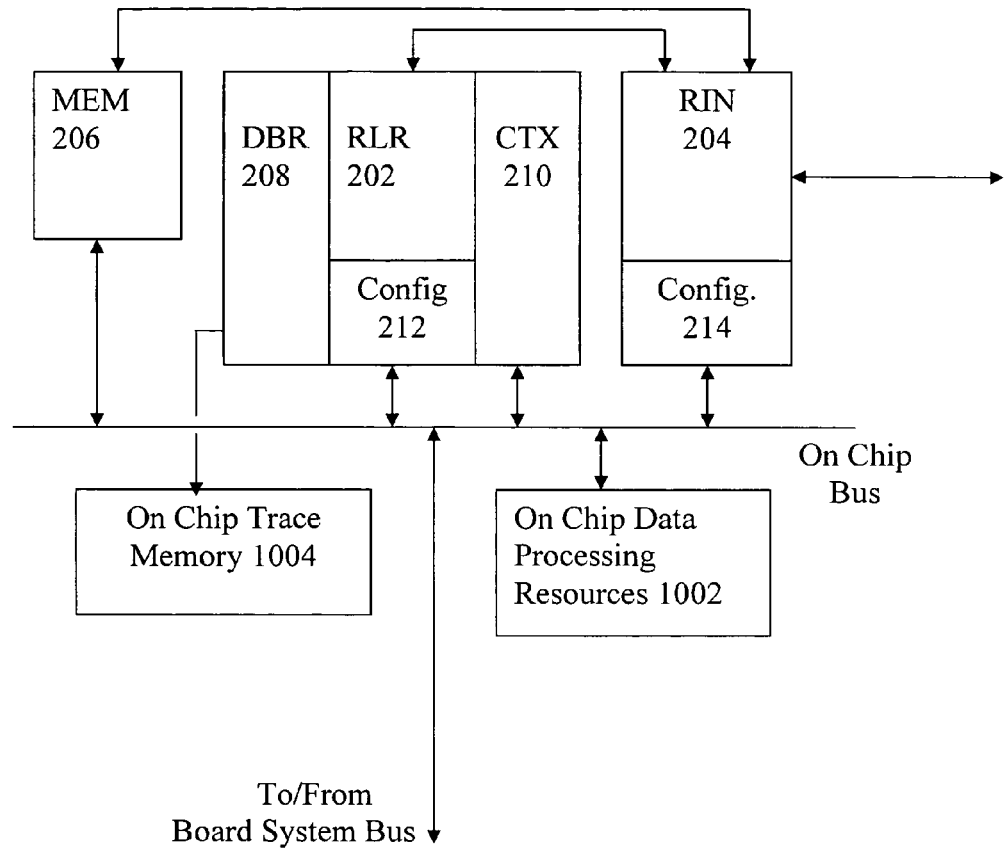
FIG. 10 is a functional block diagram of a hosted emulation IC in accordance with at least one aspect of the present invention.

In another embodiment as shown in FIG. 10, emulation IC 104' includes reconfigurable LEs (RLR) 202, reconfigurable interconnects (RIN) 204, emulation memory (MEM) 206, debugging resources (DBR) 208, context or state elements (CTX) 210, configuration registers (CR) 212 and 214 coupled to each other as before (i.e. through on-chip bus), data processing resources 1002 and trace memory 1004 coupled to the debugging resources (DBR) 208. Data processing resources 1002 are provided to supplement or replace data processing 102 provided to logic board 100. Similarly, trace memory 1004 may be provided to augment or replace trace memory 110 provided to host logic board 100.

While the methods and apparatus of the present invention have been described in terms of the above-illustrated embodiments, those skilled in the art will recognize that the various aspects of the present invention are not limited to the embodiments described. The present invention can be practiced with modifications and alterations within the spirit and scope of the appended claims. The description is thus to be regarded as illustrative instead of restrictive on the present invention.

What is claimed is:

1. An emulation board, comprising:
   a first integrated circuit, that is part of the emulation board, having a first reconfigurable resource;
   a first processing resource, that is part of the emulation board, in communication with, and operable to configure, the first reconfigurable resource;
   a first memory, that is part of the first processing resource, having stored therein programmed instructions for configuring the first reconfigurable resource; and
   a first processor, that is part of the first processing resource, for executing the programmed instructions of the first memory.

2. The emulation board of claim 1, further comprising a plurality of reconfigurable resources that are part of the emulation board, each reconfigurable resource having available processing resource, that is part of the emulation board, operable to configure the reconfigurable resource.

3. The emulation board of claim 1, wherein the first reconfigurable resource is a reconfigurable input/output resource.

4. The emulation board of claim 1, wherein the first reconfigurable resource is a reconfigurable logic resource.

5. The emulation board of claim 1, wherein the first reconfigurable resource is a reconfigurable interconnect resource.

6. The emulation board of claim 1, wherein the first processing resource is operable to configure the first reconfigurable resource in response to an external command.

7. The emulation board of claim 6, wherein the external command comprises a data packet.

8. The emulation board of claim 7, wherein the data packet comprises:
a packet header;
a command field; and
a parameter field.

9. The emulation board of claim 1, wherein the first integrated circuit comprises:
an on-chip processing resource, operative to assist the first processing resource in configuring the first reconfigurable resource;
an on-chip memory, that is part of the on-chip processing resource, having stored therein programmed instructions for configuring the first reconfigurable resource; and
an on-chip processor, that is part of the on-chip processing resource, for executing the programmed instructions of the on-chip memory.

10. The emulation board of claim 1, comprising:
a second reconfigurable resource that is part of the emulation board;
a second processing resource, that is part of the emulation board, in communication with, and operable to check a configuration of, the second reconfigurable resource;
a second memory, that is part of the second processing resource, having stored therein programmed instructions for confirming a configuration of the second reconfigurable resource; and
a second processor, that is part of the second processing resource, for executing the programmed instructions of the second memory.

11. The emulation board of claim 10, wherein a confirmation is performed by comparing a configuration, of the second reconfigurable resource, to commands received.

12. The emulation board of claim 1, further comprising:
a first software module, of the first memory, having programmed instructions for configuring the first reconfigurable resource; and
a second software module, of the first memory, that controls invocation of the first software module.

13. The emulation board of claim 12, wherein the second software module performs invocation of the first software module in response to an external command.

14. In an emulation board comprising a first reconfigurable resource that is part of the emulation board, a first integrated circuit having at least part of the first reconfigurable resource, a first processing resource that is part of the emulation board, a first memory that is part of the first processing resource and a first processor that is part of the first processing resource, a method comprising:
receiving, by the first processing resource, a command to configure the emulation board;
executing programmed instructions, of the first memory by the first processor, for configuring the first reconfigurable resource; and
configuring, by the first processing resource, the first reconfigurable resource.

15. The method of claim 14, wherein the first reconfigurable resource is a reconfigurable input/output resource.

16. The method of claim 14, wherein the first reconfigurable resource is a reconfigurable logic resource.

17. The method of claim 14, wherein the first reconfigurable resource is a reconfigurable interconnect resource.

18. The method of claim 14, wherein the command to configure is a data packet received from a system external to the emulation board.

19. The method of claim 14, where the first integrated circuit further comprises an on-chip processing resource, an on-chip memory that is part of the on-chip processing resource and an on-chip processor that is part of the on-chip processing resource, the method further comprising the following steps:
executing programmed instructions, of the on-chip memory by the on-chip processor, for configuring the first reconfigurable resource; and
configuring, by assistance of the on-chip processing resource, the first reconfigurable resource.

20. The method of claim 14, where the emulation board comprises a second reconfigurable resource that is part of the emulation board, a second processing resource that is part of the emulation board, a second memory that is part of the second processing resource and a second processor that is part of the second processing resource, the method further comprising the following steps:
executing programmed instructions, of the second memory by the second processor, for confirming a configuration of the second reconfigurable resource; and
checking with the second processing resource, that is in communication with the second reconfigurable resource, a configuration of the second reconfigurable resource.

21. The method of claim 14, further comprising the following steps:
executing programmed instructions, of a second software module of the first memory, that control invocation of a first software module of the first memory; and
executing programmed instructions, of the first software module, for configuring the first reconfigurable resource.

22. An emulation system comprising:
a computer having electronic design automation software to partition an integrated circuit design into a plurality of partitions;
a first emulation board external to, but in communication with, the computer;
a first reconfigurable resource that is part of the first emulation board;
a first integrated circuit having at least part of the first reconfigurable resource;
a first processing resource that is part of the first emulation board, in communication with, and operable to configure, the first reconfigurable resource in response to commands from the electronic design automation software of the computer;
a first memory, that is part of the first processing resource, having stored therein programmed instructions for configuring the first reconfigurable resource; and a first processor, that is part of the first processing resource, for executing the programmed instructions of the first memory.

23. The emulation system of claim 22, comprising:
a second emulation board external to the computer;
a second reconfigurable resource that is part of the second emulation board;
a second integrated circuit having at least part of the second reconfigurable resource;
a second processing resource of the second emulation board, in communication with, and operable to configure, the second reconfigurable resource in response to commands from the electronic design automation software of the computer;
a second memory of the second emulation board, that is part of the second processing resource, having stored therein programmed instructions for configuring the second reconfigurable resource;
a second processor of the second emulation board, that is part of the second processing resource, for executing the programmed instructions of the second memory; and
wherein the first and second emulation boards, that are external to each other, distributively configure the first and second reconfigurable resources.

24. The emulation system of claim 23, further comprising:
a first software module, of the first memory, having the programmed instructions for configuring the first reconfigurable resource;
a third software module, of the first memory, that controls invocation of the first software module;
a second software module, of the second memory, having the programmed instructions for configuring the second reconfigurable resource; and
a fourth software module, of the second memory, that controls invocation of the second software module.

25. The emulation system as set forth in claim 22, wherein provision of programmed instructions by the computer, to the first memory, is staged.

26. In an emulation system comprising a computer having electronic design automation software to partition an integrated circuit design into a plurality of partitions, a first emulation board external to the computer, a first reconfigurable resource that is part of the first emulation board, a first integrated circuit having at least part of the first reconfigurable resource, a first processing resource that is part of the first emulation board, a first memory that is part of the first processing resource and a first processor that is part of the first processing resource, a method comprising:
transmitting a first command from the electronic design automation software of the computer to the first processing resource;
executing programmed instructions, of the first memory by the first processor, for configuring the first reconfigurable resource; and
configuring, by the first processing resource, the first reconfigurable resource in accordance with the first command.

27. The method of claim 26, where the emulation system further comprises a second emulation board external to the computer, a second reconfigurable resource that is part of the second emulation board, a second integrated circuit having at least part of the second reconfigurable resource, a second processing resource that is part of the second emulation board, a second memory that is part of the second processing resource and a second processor that is part of the second processing resource, the method further comprising:
transmitting a second command from the electronic design automation software of the computer to the second processing resource;
executing programmed instructions, of the second memory by the second processor, for configuring the second reconfigurable resource;
configuring, by the second processing resource, the second reconfigurable resource in accordance with the second command; and
wherein the first and second emulation boards, that are external to each other, distributively configure the first and second reconfigurable resources.

28. The method of claim 27, further comprising the following steps:
executing programmed instructions, of a third software module of the first memory, that controls invocation of a first software module of the first memory;
executing programmed instructions, of the first software module, for configuring the first reconfigurable resource;
executing programmed instructions, of a fourth software module of the second memory, that controls invocation of a second software module of the second memory; and
executing programmed instructions, of the second software module, for configuring the second reconfigurable resource.

29. The method of 34, further comprising:
transferring, according to a staged process, programmed instructions from the computer to the first memory.

* * * * *